United States Patent [19]

Lynn

[11] Patent Number: 4,928,307
[45] Date of Patent: May 22, 1990

[54] TIME DEPENDENT, VARIABLE AMPLITUDE THRESHOLD OUTPUT CIRCUIT FOR FREQUENCY VARIANT AND FREQUENCY INVARIANT SIGNAL DISCRIMINATION

[75] Inventor: Dwight D. Lynn, Santa Cruz, Calif.

[73] Assignee: ACS Communications, Scotts Valley, Calif.

[21] Appl. No.: 318,073

[22] Filed: Mar. 2, 1989

[51] Int. Cl.⁵ ............................................... H04M 1/60
[52] U.S. Cl. .................................... 379/395; 379/387;
381/72; 381/94
[58] Field of Search ................. 381/74, 104, 106, 107,
381/108, 72; 379/395, 387, 390, 388; 333/14

[56] References Cited

U.S. PATENT DOCUMENTS 4,386,236  5/1983  Ferrieu et al. .................. 379/395 X
4,536,888  8/1985  Wilson ............................... 381/106

Primary Examiner—Jin F. Ng
Assistant Examiner—Randall S. Vaas
Attorney, Agent, or Firm—Limbach, Limbach & Sutton

[57] ABSTRACT

A voice signal compression system wherein the compression threshold may be adjusted to a calibrated level. The system includes a variable gain amplifier for amplifying a voice input signal based on the application of a variable control voltage. A driver increases the power gain of the amplified input signal to provide a power-boosted output signal. In addition to applying the power-boosted output signal to an acoustic output transducer, the power-boosted output is also applied both to a peak detecting comparator and to a threshold reset timer. The comparator produces a digital output that triggers an attack/decay timing generator which produces the control voltage for the variable gain amplifier. The comparator initially is set to a high threshold state by the threshold reset timer. As the levels and peaks of the input signal increase, the comparator begins to trigger digital pulses to the attack/decay timer. At the same time, the threshold reset timer begins measuring the duration of the signal which exceeds the threshold of the comparator. If the threshold reset timer detects that the level of the power-boosted output signal exceeds the threshold of the comparator for a preselected time, then the compression threshold of the comparator is switched to a lower level. The threshold remains low until the continuous signal is removed. At this point, the circuit is reset to its normal mode of operation.

6 Claims, 2 Drawing Sheets

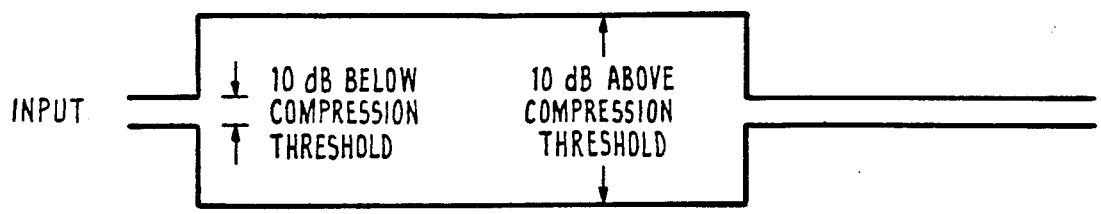
FIG. 1A.
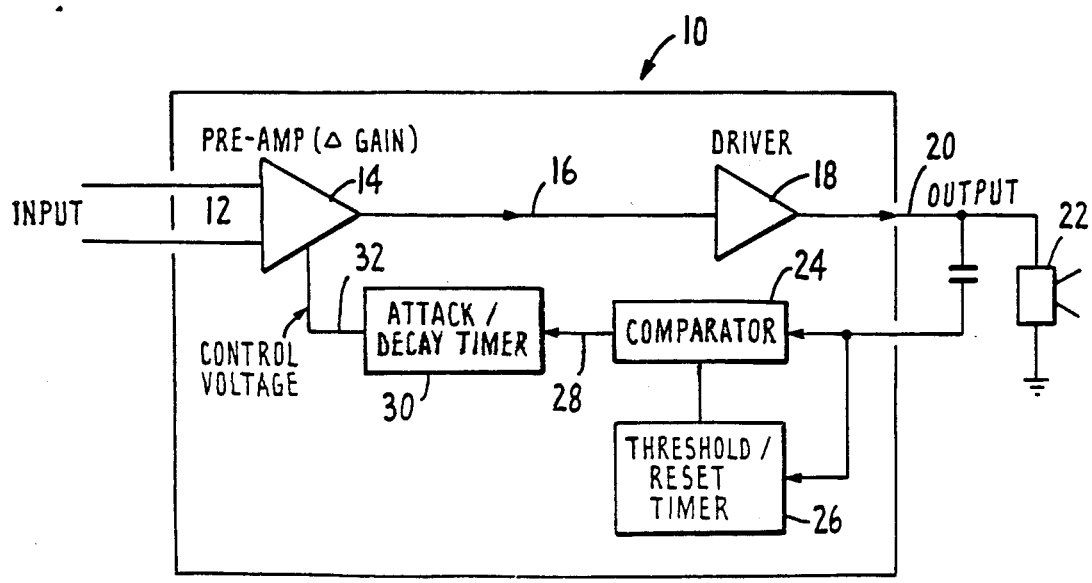
FIG. 1B.
FIG. 2.

TIME DEPENDENT, VARIABLE AMPLITUDE THRESHOLD OUTPUT CIRCUIT FOR FREQUENCY VARIANT AND FREQUENCY INVARIANT SIGNAL DISCRIMINATION

BACKGROUND OF THE INVENTION

1. Field of the Invention

The present invention relates to communications equipment and, in particular, to apparatus for multi-level control of signals in telephone headsets and handsets.

2. Discussion of the Prior Art

The telephone system is more widely used now than ever before. The increasing convenience and economics of its use make it possible not only to convey information readily, but also to open its use to all social and economic levels. However, the increased use of the system has magnified some of its hazards.

Transient, impulse and large continuous noise tones appear within the telephone system. These tones may be caused by systems testing, power crosses, misdialed calls to facsimile machines or computer modems, lightning stikes or a variety of other events. Although the probability of experiencing the annoyance and surprise of these occurrences has increased, they have not generally been considered a hazard with a telephone handset. A telephone handset is typically held in the user's hand and can be quickly removed from the user's ear if uncomfortable noise levels are encountered. However, this is not the case with telephone headsets.

Because a telephone headset is worn by its user and cannot be quickly removed from the user's ear, noise level standards have been developed to protect the user. Institutions that use a large number of telephones usually require noise protection devices in all telephone headsets. Furthermore, headsets with volume controls are required to incorporate automatic gain control (AGC) circuitry for limiting the amplitude of the earphone speaker output by some headset users.

To properly protect against continuous noise, the U.S Occupational Safety and Health Administration (OSHA) has established a 95 dBA limit for a signal exposure of 4.0 hours per day. This is the estimated on-line time of a telephone operator during an average 8 hour shift based on telephone industry data. The designation "dBA" is 20 times the log of a sound level with respect to 20 microPascals, which is 'A' weighted and time averaged.

To protect against continuous high-level sound signals, AGC circuitry is normally adjusted so that the earphone speaker output will not exceed 95 dBSPL. The term "dBSPL" refers to "sound pressure level", which is the same as "dBA" except that the 'A' weighting curve is removed along with the time averaging. Limiting sound to a dBSPL rating is easily accomplished by the use of AGC circuitry with peak detecting control.

Within the difference between the "dBA" and "dBSPL" sound ratings, there lies a problem. The "dBA" limit allows for the acoustic peaks and valleys that normally occur in speech by virtue of its time averaging feature. However, the peak detection methods required by the "dBSPL" circuits do not. The crest factor of a continuous sine wave is 1.414, whereas the crest factor of normal speech may exceed 5 (the "crest factor" can simply be described as the ratio of a waveform's "peak" value to the "rms" value).

Because of the crest factor, AGC circuitry will limit human voice signals to a level far below 95 dBA. User safety with respect to peaks and continuous sound is preserved with this limit, but the level of human voice output signal from the earphone speaker in normal environments is difficult to understand. This has its own deleterious effect by adding user stress because of the strain required to hear the signal and by decreasing productivity due to the repeated questions and statements required during conversations.

The optimum solution is to limit voice and continuous signals equally to 95 dBA. However, the crest factor of the two signal types does not allow an easily integratable peak detecting limiter circuit to be utilized.

Prior art techniques utilize variable gain circuitry that can be controlled by automatic means through a feedback control voltage. According to these techniques, when a signal is propagated through the amplifier, it is unaffected until the signal's instantaneous amplitude crosses the compression threshold. A feedback control voltage is then generated which forces the amplifier gain to decrease by a fixed amount. A peak detector is employed to aid in circuit integration. The attack time is limited to avoid "pops" or "clicks" from being generated by an abrupt gain change. A decay time from compression is also employed to maintain a relatively constant gain between syllables or utterances.

Other prior art techniques improve upon the above-described system by making the decay time dependant upon the amount of time the circuit is in compression. This method tends to run higher output levels because the short, normally occurring peaks in the voice only cause a short decay time. Therefore, the circuit returns to full gain in a shorter period of time.

SUMMARY OF THE INVENTION

The present invention provides a voice signal compression system wherein the compression threshold may be adjusted to a calibrated level. The system includes a variable gain amplifier for amplifying the voice input signal. The amplifier gain is controlled based on the application of a variable voltage. A driver increases the power gain of the amplified input signal to provide a power-boosted output. In addition to being applied to an acoustic output transducer, the power-boosted output is also applied both to a peak detecting comparator and to a threshold reset timer. The comparator produces a digital output that triggers an attack/decay timing generator which produces the control voltage for the variable gain amplifier. The comparator initially is set to a high threshold state by the threshold reset timer. As the signal levels and peaks of the input signal increase, the comparator begins to trigger digital pulses to the attack/decay timer. At the same time, the threshold reset timer begins measuring the duration of a signal which exceeds the threshold of the comparator. If the threshold reset timer detects that the level of the power-boosted output exceeds the threshold of the comparator for a preselected time, then the compression threshold of the comparator is switched to a lower level. The comparator threshold remains low until the continuous signal is removed. At this point, the circuit is reset to its normal mode of operation.

Thus, the circuit of the present invention accomplishes the task of allowing headset or handset users to listen to speech at more natural levels, to be protected from loud noises or speech by virtue of the first level compression circuit, and to be ultimately protected from continuous noises or tones that normally exist in the telephone system.

Other features and advantages of the present invention will be understood and appreciated by reference to the detailed description of the invention provided below which should be considered in conjunction with the accompanying drawings.

DESCRIPTION OF DRAWINGS

FIG. 1 is a timing diagram illustrating the waveform envelopes resulting from operation of a tri-level compression system in accordance with the present invention.

FIG. 2 is a block diagram illustrating a tri-level compression circuit in accordance with the present invention.

DETAILED DESCRIPTION OF THE INVENTION

Figure 3:
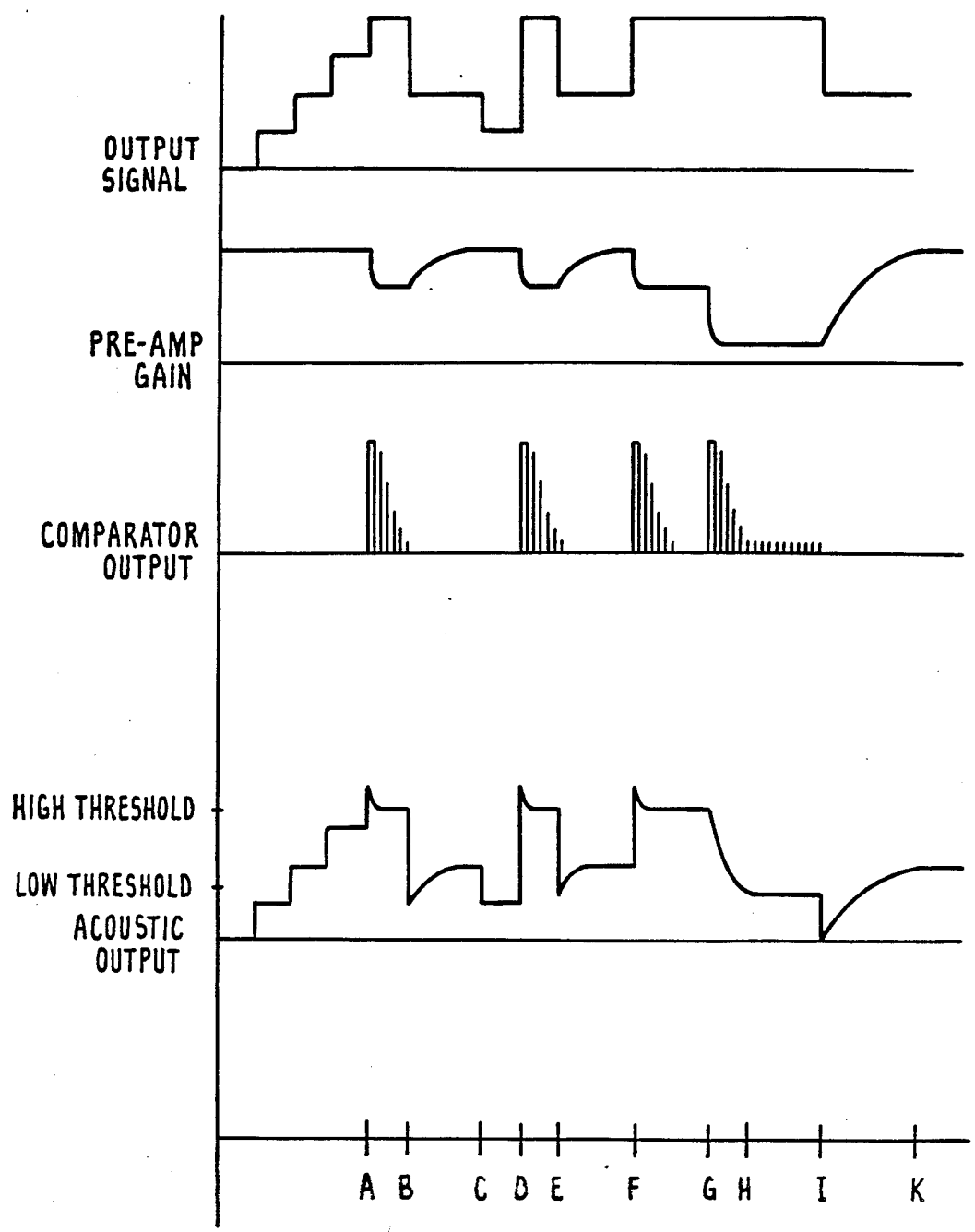
FIG. 3 is a timing diagram illustrating various waveforms generated in the operation of the FIG. 2 circuit.

Referring to FIG. 1, the present invention provides a voice signal compression system wherein, rather than setting a compression threshold for a maximum continuous tone level of 95 dBA as in the prior art techniques, the compression threshold is adjusted to a calibrated level which is perceived to be 95 dBA. This level is approximately 100dBSPL for a continuous 1KHz tone and was obtained using a subjective loudness balance method recommended in AT&T Technologies Specification KS23081.

It should be noted that a 1KHz tone at 100dBSPL is 100 dBA. The 'A' weighting curve does not alter the 1KHz frequency response of the system and the average RMS value of a continuous tone is the RMS value.

If, however, a continuous tone is applied to the compression system of the present invention for a time period of about 175–300 ms, preferably about 200 ms, the compression threshold is lowered 10dB. The result is that voice signals are safely maintained within the prescribed limits and continuous tones are lowered to 90 dBA within 175–300 ms of initial user exposure.

OSHA allows a user exposure of 100 dBA for two hours per day. A 90 dBA user exposure would be allowed for approximately 8 hours per day as shown from Table N-1 of the CAL/OSHA Noise Control Handbook, S-680.

As described in greater detail below, a reset timer is used to prevent the system of the present invention from switching to the low compression level mode during speech. Although human speech may sound continuous, it is, in fact, many utterances separated by periods of near silence. Some utterances may exceed 100 ms, while the period of silence may be 5 to 20 ms. Thus, incorporating a 150–300 ms delay before adjusting the compression threshold downward substantially avoids the problem of going to the low compression mode during speech. To ensure this, a 10 ms reset timer is used. The 10 ms reset timer resets the 150–300 ms compression level switching circuit. Therefore, at the end of most utterances, the compression circuit is reset and begins waiting for another utterance, sound or noise that persists for longer than 200 ms. Once the lower compression level is achieved, it is maintained until a 10 ms break appears.

Referring to FIG. 2, one embodiment of a tri-level compression circuit 10 that provides the above-described signal control in accordance with the present invention includes five functional blocks. A differential input 12 representative of the signal received by the headset over the telephone lines is applied to a floating differential pre-amplifier 14. The gain of the pre-amplifier 14 is controlled and initially established at a pre-determined gain level by attack/delay timer 30 via control voltage 32. The gain of the pre-amplifier 14 may be reduced by changing the control voltage 32, as described in greater detail below. In the FIG. 2 embodiment of the invention, the output 16 of the pre-amplifier 14 is applied to a driver 18 which increases the power gain of the signal 16. The power-boosted output 20 is then applied to an acoustic output transducer 22.

The driver output 20 is also applied both to a peak detecting comparator 24 and to a threshold reset timer 26.

The comparator 24 produces a pulsed digital output 28 that triggers an attack/decay timing generator 30 which produces the analog control voltage 32. As shown in FIG. 2, this control voltage 32 directly controls the gain of the input stage pre-amplifier 14.

There are two operational compression level thresholds. The high level is the normal, initial level that allows voice output at normal hearing levels. The comparator 24 initially is set to the high threshold state by the threshold reset timer 26. As the levels and peaks of input signal 12 increase, the comparator 24 begins to generator trigger pulses 28 to the attack/decay timer 30. Concurrently, the threshold reset timer 26 begins measuring the duration of the signal which exceeds the threshold of comparator 24. The higher threshold is set to safe and comfortable listening levels. The threshold reset timer 26 is continually being reset by naturally occurring breaks in the voice signal. When the incoming signal 12 is continuous enough to allow the threshold reset timer 26 to set, the compression threshold of comparator 24 is switched to a level approximately 10 dB lower than the initial level. As shown in FIG. 1, this shift occurs over a time period of approximately 80 ms. The threshold remains low until the continuous signal is removed. At this point, the circuit is reset to its normal mode of operation.

Operation of the tri-level compression circuit of the present invention may be illustrated by reference to the waveforms shown in FIG. 3. As shown in FIG. 3, prior to time A, the pre-amplifier 14 is at maximum gain. Nothing is happening because the output signal has not exceeded the compression threshold. At time A, the input signal is high enough to force the acoustic output over the compression threshold. The comparator 24 then generates pulses that cause the control voltage 32 to change. Therefore, the pre-amp gain decreases and the output signal level decreases. At time B, the input signal has decreased sufficiently to force the output below the compression threshold and the circuit returns to normal operating conditions. At time C, pre-amp 14 is again at full gain and is exactly following the input signal. The "D to E" time period shows the same results as times A and B with different input signal characteristics. At time F, the system goes into compression and holds the level for 200 ms. Time G shows that the input signal is still high after 200 ms. Thus, the output has switched to the low level mode due to the threshold shifting of the tri-level circuitry. At time H, the gain has stabilized in about 60 ms at the lower threshold. At time I, the input level has returned to a normal level and, thus, the compression threshold has also been reset to its normal level. At time K, the gain is at the nominal level after the decay time.

It should be understood that various alternatives to the embodiment of the invention described herein may be employed in practicing the invention. It is intended that the following claims define the invention and that structures within the scope of these claims and their equivalents be covered thereby.

What is claimed is:

1. A signal compression system comprising:
   (a) amplifier means for amplifying an input signal to provide a power-boosted output signal, the gain of the amplifier means corresponding to a variable control voltage applied to the amplifier means;
   (b) means for comparing the power-boosted output signal and an initial threshold signal to provide a comparator output corresponding to the difference between the power-boosted output signal and the initial threshold signal;
   (c) means responsive to the comparator output for providing a variable control voltage corresponding to the comparator output; and
   (d) means responsive to the power-boosted output signal for switching the initial threshold signal to a second threshold signal if the power-boosted output signal exceeds the initial threshold signal for a pre-selected period of time.

2. A signal compression system comprising:
   (a) a variable gain amplifier for amplifying an input signal to provide a power-boosted output signal, the gain of the amplifier corresponding to a control voltage applied to the amplifier;
   (b) a comparator for comparing the power-boosted output signal and a first threshold level signal and for providing a digital output signal if the power-boosted output signal exceeds the first threshold level signal;
   (c) timing generator means responsive to the digital output signal for generating a corresponding control voltage for the variable gain amplifier; and
   (d) reset means for detecting the level of the power-boosted output signal and for switching the first threshold level signal to a second threshold level signal if the power-boosted output signal exceeds the first threshold level signal for a preselected period of time.

3. A signal compression system comprising:
   (a) a variable gain amplifier for amplifying an input signal to provide an amplified input signal, the gain of the amplifier corresponding to a control voltage applied to the amplifier;
   (b) a driver for increasing the power gain of the amplified input signal to provide a power-boosted output signal;
   (c) a comparator for comparing the power-boosted output signal and a first threshold level signal to provide a pulsed digital output signal if the power-boosted output signal exceeds the first threshold level signal;
   (d) a threshold/reset timer for detecting the level of the power-boosted output signal and for switching the first threshold level signal to a second threshold level signal if the power-boosted output signal exceeds the first threshold level signal for a preselected period of time; and
   (e) an attack/decay timer responsive to the pulsed digital output signal for providing a control voltage to the variable gain amplifier that corresponds to the pulsed digital output signal.

4. A voice signal compression system as in claim 3 wherein the output signal is a differential input signal received over telephone lines.

5. A voice signal compression system comprising:
   (a) a variable gain amplifier for amplifying a differential input signal received over telephone lines based on the application of a variable control voltage;
   (b) a driver that increases the power gain of the amplified input signal to provide a power-boosted output signal;
   (c) a peak detecting comparator that provides a pulsed output signal if the power-boosted output signal exceeds an initial compression threshold of the comparator;
   (d) an attack/decay timer that generates a variable control voltage in response to the pulsed output signal; and
   (e) a threshold/reset timer that switches the initial compression threshold of the comparator to a lower threshold if the power-boosted output signal exceeds the initial compression threshold for a preselected period of time.

6. A method of signal compression comprising:
   (a) amplifying an input signal to provide an amplified signal corresponding to a variable gain control voltage;
   (b) comparing the amplified signal to an initial threshold level signal;
   (c) varying the variable gain control voltage based on the result of the comparison of the amplified signal and the initial threshold level signal;
   (d) detecting the level of the amplified signal; and
   (e) switching the initial threshold level signal to a second threshold level signal if the amplified signal exceeds the initial threshold level signal for a preselected period of time.

* * * * *